United States Patent
Spalink (10) Patent No.: US 8,849,230 B2
(45) Date of Patent: Sep. 30, 2014

(54) ATTENUATOR AND METHOD FOR ATTENUATING

(75) Inventor: Gerd Spalink, Stuttgart (DE)

(73) Assignee: SONY Corporation, Tokyo (JP)

( * ) Notice: Subject to any disclaimer, the term of this patent is extended or adjusted under 35 U.S.C. 154(b) by 206 days.

(21) Appl. No.: 13/364,853

(22) Filed: Feb. 2, 2012

(65) Prior Publication Data

US 2012/0225631 A1    Sep. 6, 2012

(30) Foreign Application Priority Data

Mar. 3, 2011  (EP) .................................... 11001793

(51) Int. Cl.
 *H04B 1/06*  (2006.01)
 *H04B 7/00*  (2006.01)
 *H03G 3/30*  (2006.01)

(52) U.S. Cl.
 CPC .................................. *H03G 3/3068* (2013.01)
 USPC .................. 455/250.1; 455/249.1; 455/234.2; 455/232.1; 375/345

(58) Field of Classification Search
 CPC ....... H03G 3/3068; H03G 3/20; H03G 3/001; H03G 3/3089; H04W 52/52; H04W 28/04; H03M 1/183
 USPC .......... 455/232.1, 234.1, 234.2, 249.1, 250.1, 455/127.2; 375/345
 See application file for complete search history.

(56) References Cited

U.S. PATENT DOCUMENTS

| | | | |
|---|---|---|---|
| 3,981,005 A * | 9/1976 | Takayama et al. ............ | 341/139 |
| 7,599,629 B2 | 10/2009 | Kamali et al. | |
| 2006/0018414 A1 | 1/2006 | Arkhipenkov et al. | |
| 2007/0001880 A1 * | 1/2007 | Gierenz et al. ................ | 341/118 |
| 2007/0030929 A1 | 2/2007 | Gao et al. | |
| 2010/0130153 A1 | 5/2010 | Khoini-Poorfard et al. | |

* cited by examiner

*Primary Examiner* — Yuwen Pan
*Assistant Examiner* — Fatuma Sherif
(74) *Attorney, Agent, or Firm* — Oblon, Spivak, McClelland, Maier & Neustadt, L.L.P.

(57) ABSTRACT

A semiconductor device is provided, including an input attenuator configured to receive an antenna signal and to output a first attenuated signal, the first attenuated signal corresponding to the antenna signal attenuated by a first attenuation factor, the input attenuator being further configured to receive a control signal and to select one of a plurality of predetermined attenuation factors as said first attenuation factor depending on the control signal; an analog to digital converter configured to generate an intermediate signal by digitizing the first attenuated signal; and a digital attenuator configured to receive the intermediate signal and to output a second attenuated signal, the second attenuated signal corresponding to the intermediate signal attenuated by a second attenuation factor, the second attenuation factor being set so as to compensate a gain quantization error of the control signal.

20 Claims, 6 Drawing Sheets

ATTENUATOR AND METHOD FOR ATTENUATING

An embodiment of the invention relates to a semiconductor device. A further embodiment of the invention relates to a television set. A still further embodiment relates to a method for attenuating an antenna signal.

BACKGROUND

A tuner for the reception of broadcast signals has to use automatic gain control (AGC).

BRIEF SUMMARY

It is an object of embodiments of the invention to provide a semiconductor device providing an automatic gain control which has a low power consumption, a small footprint and/or a good linearity over the full dynamic range. It is a further object to provide a respective computer program, computer program product or computer readable storage medium These objects are solved by a semiconductor device, television set, and method according to the recitations in the appended claims.

Further details of the invention will become apparent from a consideration of the drawings and ensuing description.

BRIEF DESCRIPTION OF THE SEVERAL VIEWS OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following, embodiments of the invention are described. It is important to note, that all described embodiments in the following may be combined in any way, i.e. there is no limitation that certain described embodiments may not be combined with others. Further, it should be noted that same reference signs throughout the figures denote same or similar elements.

It is to be understood that other embodiments may be utilized and structural or logical changes may be made without departing from the scope of the invention. The following detailed description, therefore, is not to be taken in a limiting sense, and the scope of the present invention is defined by the appended claims.

It is to be understood that the features of the various embodiments described herein may be combined with each other, unless specifically noted otherwise.

Figure 1:
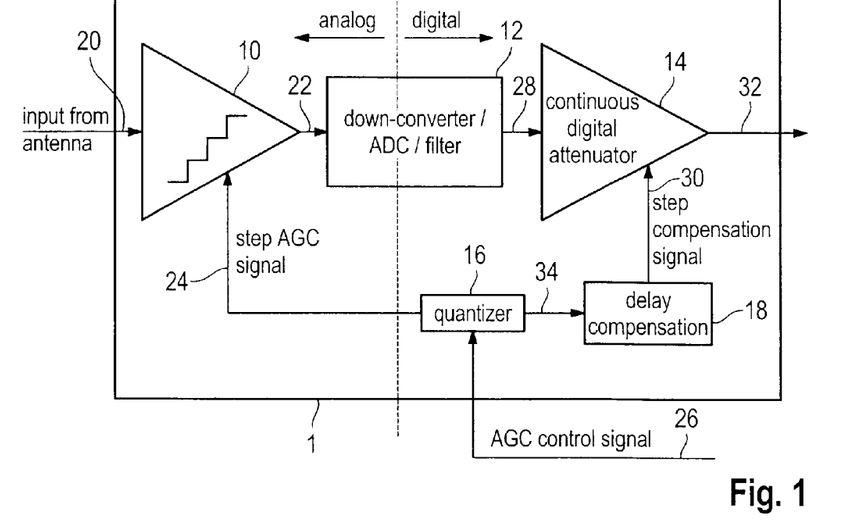
FIG. 1 shows a semiconductor device according to an embodiment of the invention.

FIG. 1 shows a semiconductor device 1 including an automatic gain control circuit. Semiconductor device 1 includes an input attenuator 10 receiving an antenna signal 20, also referred to as "RF signal". Depending on the application field of semiconductor device 1, the antenna signal 20 may be a high frequency signal in a frequency range of e.g. 40 to 1000 MHz.

In the following, the input attenuator 10 may also be referred to as "step attenuator". This is because the input attenuator 10 attenuates the antenna signal 20 with a first attenuation factor to generate a first attenuated signal 22. Thereby, the first attenuation factor is selected from a plurality of predetermined attenuation factors. Since the first attenuation factor is, thus, not a continuously changing factor, a step function of the input attenuator 10 is realized.

Input attenuator 10 has a control signal 24 as input signal. The control signal 24 is used to select one of the plurality of predetermined attenuation factors as the first attenuation factor which is then used to attenuate the antenna signal 20.

Since the control signal 24 is used to control the input attenuator 10 ("step attenuator"), control signal 24 may further below also be referred to as "step AGC signal" or "quantized AGC control signal".

Semiconductor device 1 further includes an analogue to digital converter unit 12 receiving the first attenuated signal 22 and generating an intermediate signal 28 by digitizing the first attenuated signal 22. The analogue to digital converter unit 12 may also down convert the first attenuated signal 22 and/or filter the signal 22 to remove undesired signal components or to avoid alias in the digitizing process. It should be noted that these operations may cause small latencies or processing delays to the signal 22.

Moreover, the semiconductor device 1 includes a digital attenuator 14. The digital attenuator 14 receives the intermediate signal 28 and outputs a second attenuated signal 32. The second attenuated signal 32 corresponds to the intermediate signal 28 attenuated by a second attenuation factor 44 (see FIG. 4 and further below). The second attenuation factor 44 is set such as to compensate a quantization error of the attenuation of the intermediate signal 28. In other words, the second attenuation factor 44 is set such as to compensate a quantization error of the control signal 24. As seen in FIG. 1, the quantization error is in fact a quantization error of the gain. Thus, the quantization error may also be referred to as "gain quantization error".

For compensating the quantization error the digital attenuator 14 may receive a step compensation signal 30 based on which the quantization error is compensated.

Thus, according to an embodiment of the invention, an AGC may be realized with the described input attenuator 10, the analogue to digital converter unit 12 and the digital attenuator 14.

In a further embodiment, it is possible to control the input attenuator 10 and digital attenuator 14 by the control signal 24 and the step compensation signal 30, respectively.

The control signal 24 may also be referred to as "step AGC signal". Control signal 24 may be generated by a quantizing unit 16. Further, step compensation signal 30 may be generated by the quantizing unit 16 and/or a delay compensation unit 18.

In practical implementations, the signal processing may have a delay from quantizing unit 16 through the input attenuator 10, and the analogue to digital converter unit 12 up to the digital attenuator 14. To completely eliminate the steps at the output of the digital attenuator 14 (which have been caused by the input attenuator 10), i.e. at the multiplying unit 40 ("digital step compensation multiplier"), it is necessary to insert the same delay into the step compensation path (see delay compensation unit 18 delaying pre-step compensation signal 34. The delay compensation unit 18 may be an adjustable delay for the case that the exact properties of the analogue to digital signal path are not known at the time that the digital circuit is designed.

Quantizing unit 16 generates the control signal 24 and a pre-step compensation signal 34 based on an AGC control signal 26. The AGC control signal 26 may also be referred to as "continuous AGC control signal" or "high resolution AGC control signal" since it has a very high resolution as helpful for an accurate AGC. The term "continuous" refers to continues levels (not time). In contrast, since the control signal 24 has a lower resolution, may also be referred to as "low resolution AGC signal".

As indicated by the dashed line in FIG. 1, the input attenuator 10 operates with analogue signals. Further, the digital attenuator 14, quantizer 16 and delay compensation unit 18 work based on digital signals.

An advantage of the embodiment shown in FIG. 1 is that it is possible to provide a highly reliable and precise AGC on semiconductor device 1. Thus, it is possible to provide a high precision AGC on a CMOS silicon tuner. Generally, since the digital components scale with the advances in semiconductor scaling only a small area is needed. Further, the switched step attenuator as opposed to a conventional continuous analogue variable gain amplifier has less power consumption, higher dynamic range and a better noise figure.

It should be noted that depending on the design and environment in which the circuit shown in FIG. 1 is to be used, some of the components, e.g. any of components 10, 16, 12, 14 and 19, need not be realized on a single semiconductor device as shown in FIG. 1. In other words, not all of the components need to be on the same chip. In other embodiments, some of the components may be located on other chips or be realized by other hardware components. For example, in a possible embodiment, components 12, 14, 16 and 18 could be on one chip whereas the input attenuator 10 could be realized separately.

Figure 2:
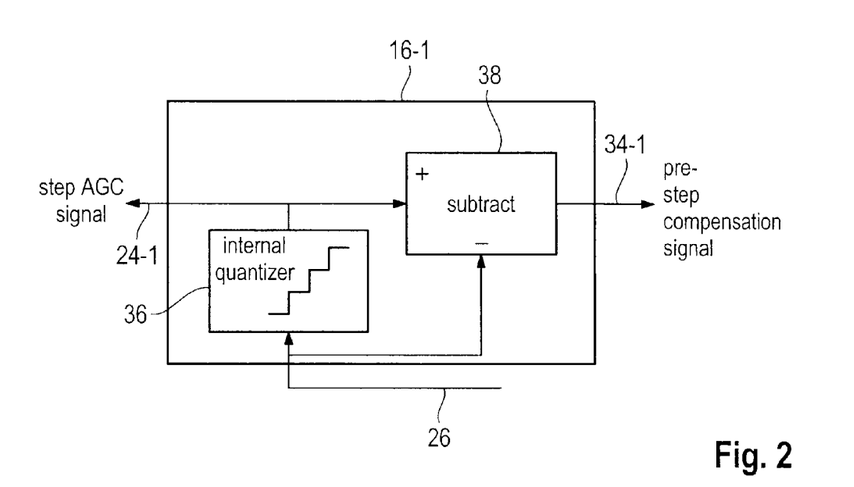
FIG. 2 shows details of a quantizer which may be used in the semiconductor device of FIG. 1.
Figure 9:
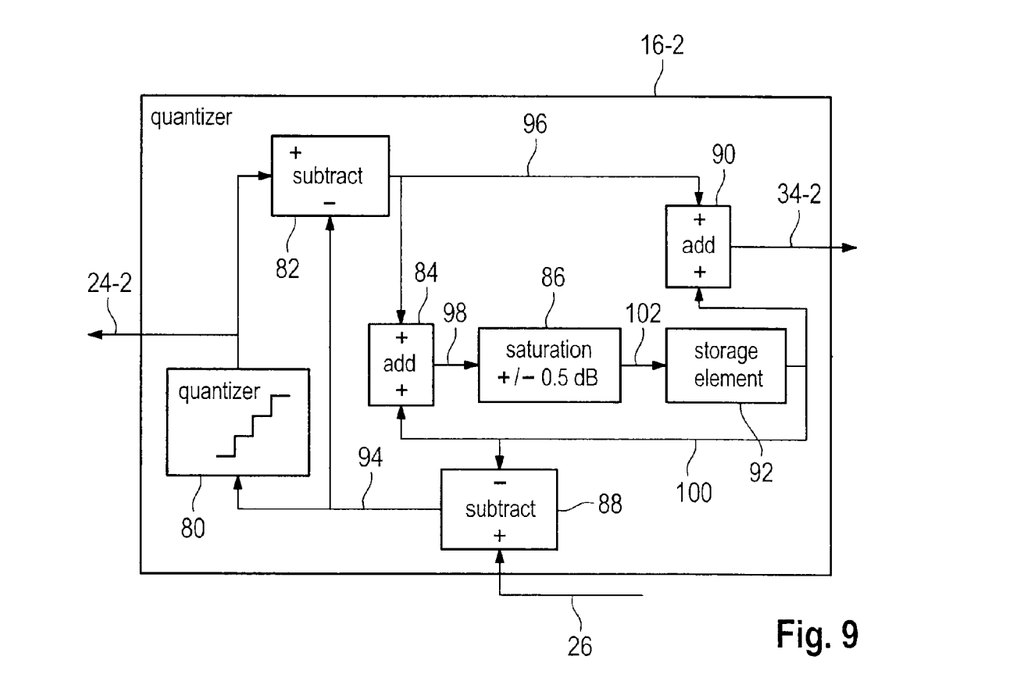
FIG. 9 shows an embodiment of a quantizer adapted to realize a hysteresis function as shown in FIGS. 8A and 8B.

FIG. 2 shows an embodiment of quantizing unit 16 shown in FIG. 1. In the following, the embodiment of quantizing unit 16 will be referenced with reference sign 16-1. A further embodiment of quantizing unit 16 is shown in FIG. 9 and will be referenced with reference sign 16-2 (see below). It should be noted that further other embodiments of quantizing unit 16 are possible.

As depicted in FIG. 2, quantizing unit 16-1 may include an internal quantizer 36 and a subtraction unit 38.

Internal quantizer 36 and subtraction unit 38 both have as input the AGC control signal 26. The internal quantizer 36 generates, based on the AGC control signal 26, the control signal 24 by respectively quantizing the AGC control signal 26.

The resolution of the 'continuous' AGC control signal 26 is e.g. 0.004 dB (thus, the resolution is high). The resolution of the step AGC signal (control signal 26) is e.g. 1 dB (thus, compared to the resolution of the continuous AGC control signal 26, the resolution of the control signal 26 is low).

Further, the subtraction unit 38 receives the control signal 24 and generates the pre-step compensation signal 34-1 by subtracting the AGC control signal 26 from the control signal 24. It should be noted that the pre-step compensation signal 34-1 in FIG. 2 corresponds to the pre-step compensation signal 34 in FIG. 1, i.e. in case the quantizing unit 16-1 is used in the circuit shown in FIG. 1, the pre-step compensation signal 34-1 will be used as input for the delay compensation unit 18.

Figure 3:
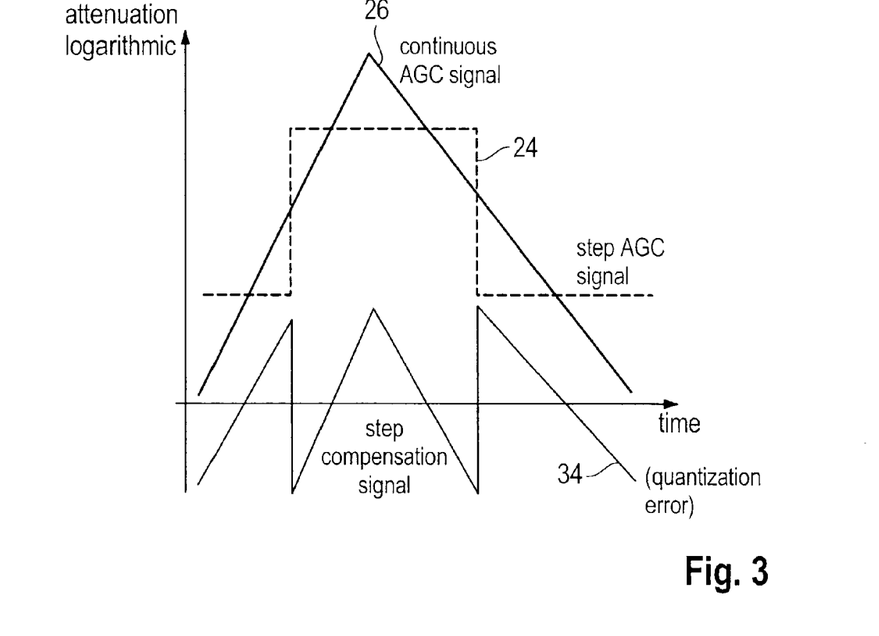
FIG. 3 shows a diagram for explaining the functioning of the quantizer of FIG. 2.

FIG. 3 depicts the functioning of the quantizing unit 16-1 shown in FIG. 2. As seen, the pre-step compensation signal 34 is generated by subtracting the AGC control signal 26 from the control signal 24 (step AGC signal).

Figure 4:
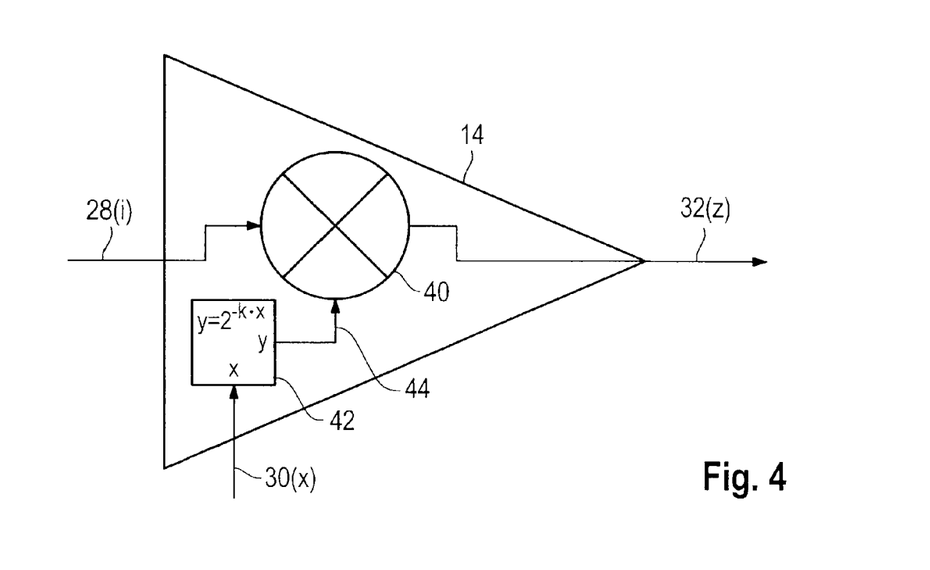
FIG. 4 shows an embodiment of the digital attenuator of FIG. 1.

It should be understood that the diagram in FIG. 3 is based on a logarithmic representation. In other words, the step AGC signal 24 and step compensation signal 30 are generated such as to correspond to logarithmic representations for controlling the input attenuator 10 and digital attenuator 14. The reason is that in this case the basic property of logarithmic representations $$\log(a \times b) = \log(a) + \log(b),$$

can be applied (see FIG. 4 where the exploration of this basic property will become apparent)

If the step AGC signal 24 corresponds to log(a) and the step compensation signal 30 corresponds to log(b), the antenna signal 20 to u, the step attenuator output signal 22 to v and the step compensator output signal 32 to w, we get $$v = u*e\hat{\,}(\log(a))$$

$$w = v*e\hat{\,}(\log(b))$$

Thus $w = u*e\hat{\,}(\log(a))*e\hat{\,}(\log(b)) = u*e\hat{\,}(\log(a) + \log(b))$ The total gain is $w/u = e\hat{\,}(\log(a) + \log(b))$, in logarithmic terms $$\log(w/u) = \log(a) + \log(b)$$

Thus, a certain total gain can be achieved by an additive combination of two separate gain signals applied to separate gain multipliers. Additive combination is possible if exponentiation is applied between the gain control signal and the input to the gain multiplier.

FIG. 4 shows an embodiment of the digital attenuator 14.

Digital attenuator 14 includes a multiplying unit 40 and a functional unit 42.

The digital attenuator 14 generates the second attenuated signal 32 by realizing the following function based on the multiplying unit 40 and functional unit 42:

$$z = i \cdot 2^{-kx}$$

where
z: second attenuated signal (32);
i: intermediate signal (28);
$2^{-kx}$: second attenuation factor (44).

The factor k may be set so that the attenuation magnitude of the input step attenuator 10 and the digital attenuator 14 are identical for one step of the input step attenuator.

Figure 5:
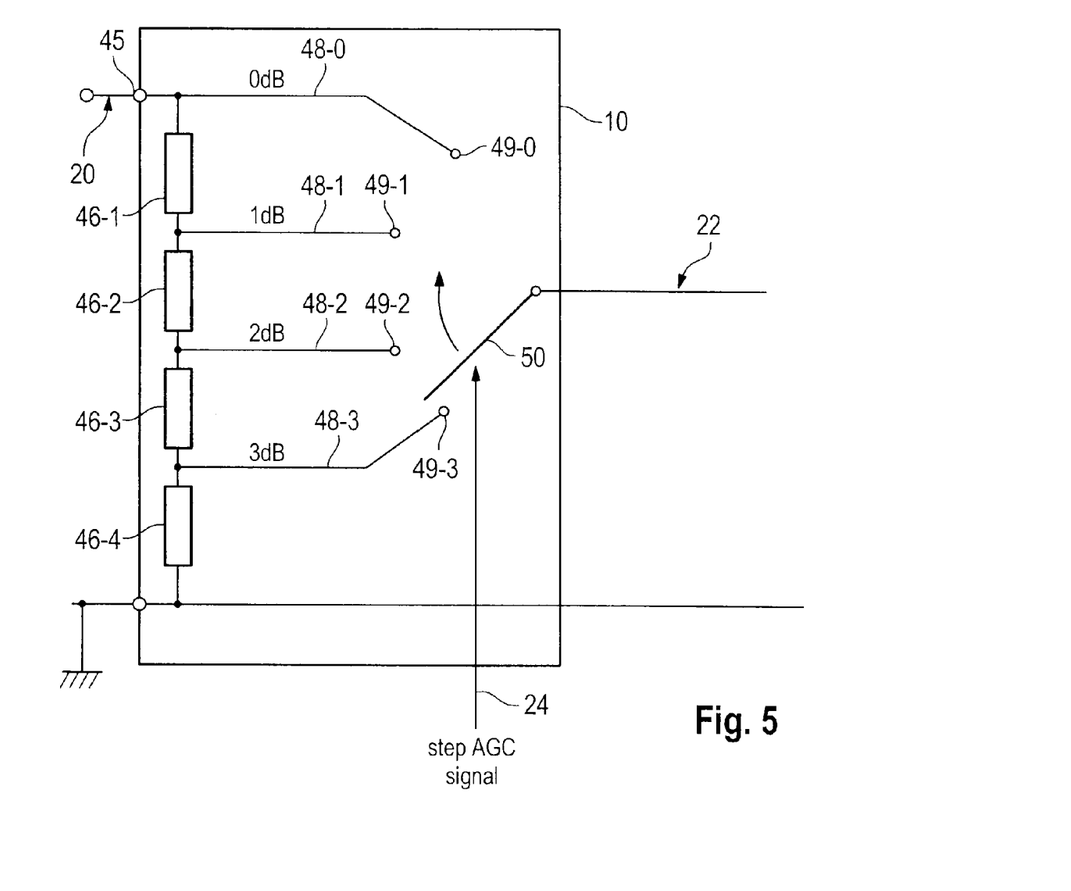
FIG. 5 shows an embodiment of the input attenuator shown in FIG. 1.

FIG. 5 shows an embodiment of the input attenuator 10. In this embodiment, the input attenuator 10 comprises a plurality of resistors 46-1, 46-2, 46-3 and 46-4. It should be noted that although only four resistors are shown in FIG. 5, this is not to be understood as limiting by any means. The number of four resistors is only used for illustrative purposes. In reality, larger numbers of resistors are used. For example, the input attenuator 10 may comprise 64 resistors.

The resistors are arranged in series between the input signal line of the input 45 of input attenuator 10 which corresponds to the antenna signal 20, and ground.

The input attenuator 10 further comprises a plurality of contacts 49-0, 49-1, 49-2 and 49-3 arranged at the terminals of signal lines 48-0, 48-1, 48-2, 48-3. Signal line 48-0 carries the antenna signal 20 without any attenuation.

Depending on the resistance values of resistors 46-1, 46-2, 46-3 and 46-4, different levels of attenuation may be achieved. In the example of FIG. 5 the resistance values of resistors 46-1, 46-2, 46-3 and 46-4 are chosen such that at contact 49-1 the antenna signal 20 attenuated by 1 dB may be tapped, at contact 49-2 the antenna signal 20 attenuated by 2 dB may be tapped and at contact 49-3 the antenna signal 20 attenuated by 3 dB may be tapped. In other words, signal lines 48-0, 48-1, 48-2, 48-3 carry the antenna signal respectively attenuated by 0 dB, 1 dB, 2 dB and 3 dB.

It should be noted that the levels of attenuation in FIG. 5 are not to be understood as limiting by any means. Depending on the design of the AGC circuit needed for a certain application, different suitable levels of attenuation may be achieved by respectively setting suitable resistance values of the resistors.

As depicted in FIG. 5, the input attenuator 10 further comprises a switch 50. The switch 50 generates the first attenuated signal 22 by connecting the output of the switch to a selected one of the plurality of contacts 49-0, 49-1, 49-2 and 49-3. The switching is done based on the control signal 24.

It should be noted that the input attenuator 10 having the design shown in FIG. 5 has some advantages over other possible e.g. continuously operating attenuators: The resistors have a good linearity and, hence, the output signal (first attenuated signal 22) has a low distortion. Further, the attenuation only depends on the ratio of the resistor values, not the absolute values. For resistors integrated on a single semiconductor device, achieving a precise ratio is much easier than achieving a precise absolute value.

On the other hand, the usage of the input attenuator 10 having a circuitry as shown in FIG. 5 obviously causes a "step wise" attenuated signal, i.e. the first attenuated signal 22 is only attenuated by the selected attenuation level (0 dB, 1 dB, 2 dB and 3 dB in FIG. 5). Hence a quantization error will be caused as described above. In case the first attenuated signal 22 would not be further processed as described above, the result would be sudden reception signal power changes when the gain is changed. These power changes would produce for example

- visible problems in analogue TV reception
- audible clicks in FM radio reception
- bit errors in DVB-C reception or other continuous digital modulation schemes
- when the step timings are not synchronized with the OFDM packets, also bit errors in DVB-T, DVB-T2 and DVB-C2 may happen.

In order to avoid such problems, the digital attenuator 14 is designed such as to compensate the quantization error as described above.

Figure 6:
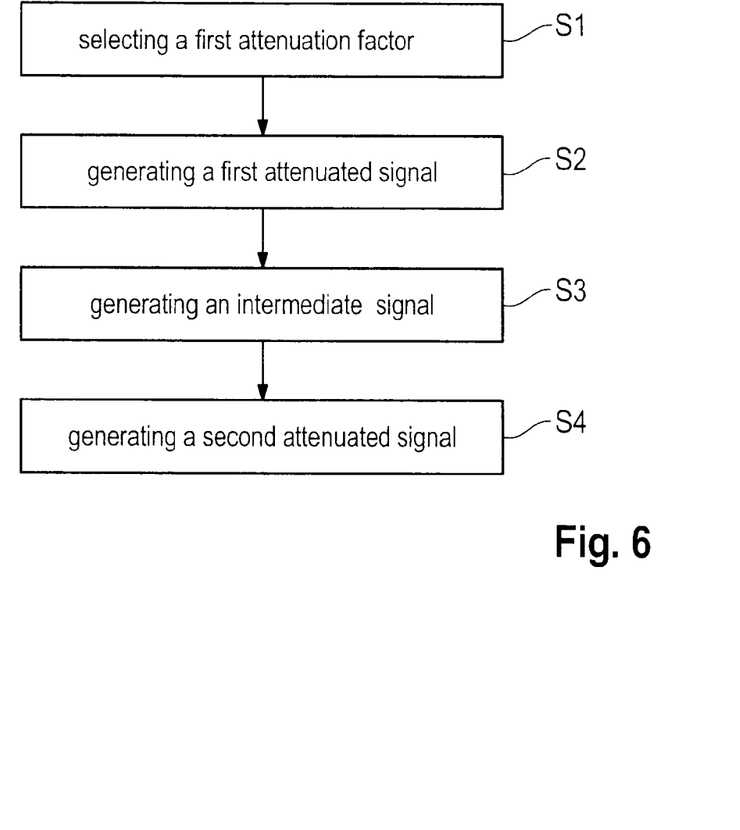
FIG. 6 shows steps according to a method for attenuating an antenna signal.

FIG. 6 shows steps of a method according to an embodiment of the invention.

At S1, one of a plurality of predetermined attenuation factors is selected as first attenuation factor depending on a control signal, e.g. control signal 24.

Further, at S2, a first attenuated signal is generated by attenuating an antenna signal, e.g. the antenna signal 20, by the first attenuation factor.

Further, at S3, an intermediate signal, e.g. the intermediate signal 28, is generated by digitizing the first attenuated signal.

Then, at S4, a second attenuated signal, e.g. the second attenuated signal 32, is generated, the second attenuated signal corresponding to the intermediate signal attenuated by a second attenuation factor, the second attenuation factor being set such as to compensate a quantization error of the intermediate signal.

Further possible method steps are: receiving an AGC control signal and outputting a quantized AGC control signal which is used as the control signal such that a certain one of the plurality of predetermined attenuation factors corresponds to one quantization step of a quantized AGC control signal.

Further, the method may comprise generating a compensation signal by subtracting the AGC control signal from the quantized AGC control signal.

Still further, the method may comprise compensating a delay caused by the input attenuator and/or the digital converter unit by delaying the compensation signal. Further method steps may be possible as will be apparent from the functions of the respective components described above in FIGS. 1 to 5. In fact, it should be noted that all components shown in FIGS. 1 to 5 have certain functions which could be applied in the method of FIG. 6 in accordingly arranged method steps.

Figure 7:
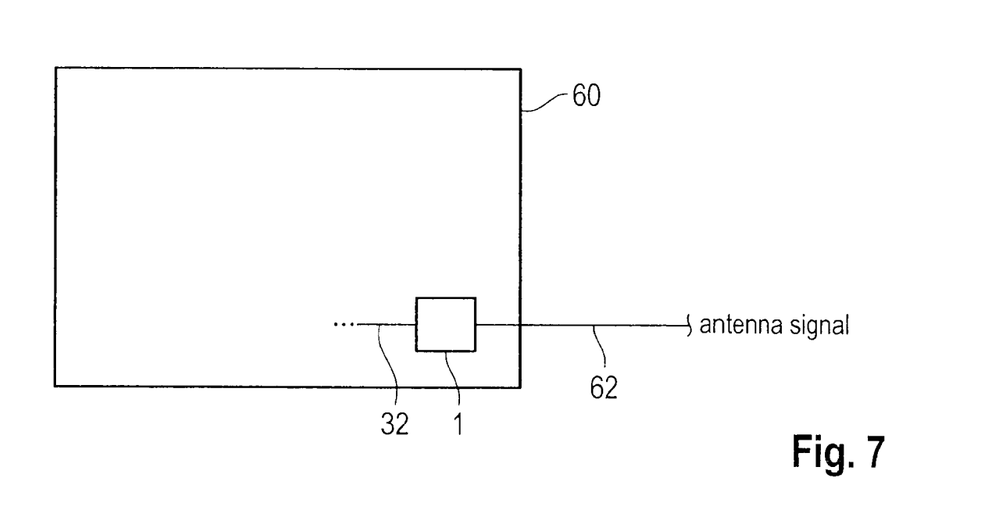
FIG. 7 shows a television set according to an embodiment of the invent ion.

FIG. 7 shows a television set 60 connected to an antenna cable 62. The antenna cable 62 provides an antenna signal.

Further, television set 60 includes a semiconductor device 1 as shown in FIG. 1. Thus, the television set 60 includes a circuitry for AGC. The output signal generated by a semiconductor device 1 corresponding to the second attenuated signal 32 shown in FIG. 1 will be used for further processing in television set 60. The second attenuation signal 32 may be connected to a demodulator block. The demodulator block may e.g. extract the picture and the sound from the signal.

It should be noted that although FIG. 7 shows a television set, the semiconductor device shown in FIG. 1 may likewise be employed in a variety of other devices such as e.g. a radio. Moreover, the antenna signal in FIG. 7 may be a digital or analogue television signal.

Other possible applications are personal computers, home servers or hard disk recorders.

Figure 8A:
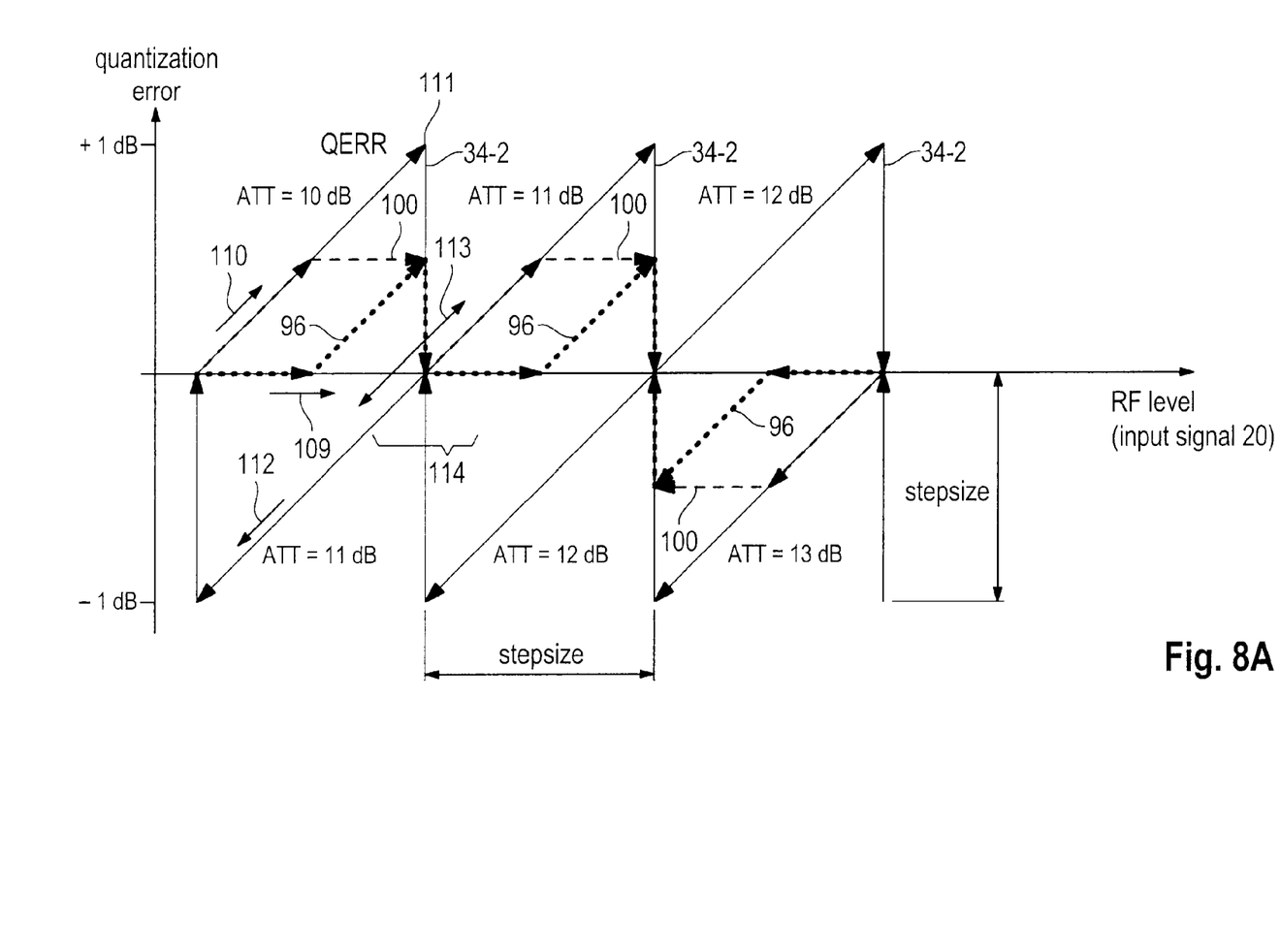
FIG. 8A shows a quantization error in case the quantizer realizes a hysteresis function.
Figure 8B:
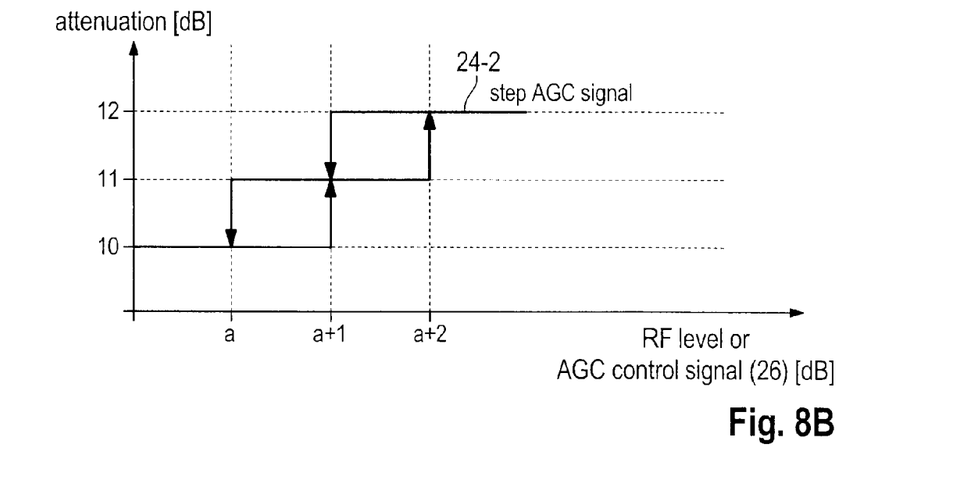
FIG. 8B shows the step AGC signal in case the quantizer realizes a hysteresis function.

FIGS. 8A, 8B and 9 explain an alternative embodiment for quantizer 16 shown in FIG. 1. FIGS. 8A and 8B show a diagram for explaining the functioning of the embodiment of the quantizer 16-2 shown in FIG. 9.

The x-axis (abscissa) of the diagram in FIG. 8A corresponds to the input signal 20 of FIG. 1 (RF input signal).

The y-axis (ordinate) in FIG. 8A corresponds to the output signal 34-2 of quantizer 16-2 in FIG. 9. The output signal 34-2 is equal to the pre-step compensation signal 34 in FIG. 1 in case quantizing unit 16 in FIG. 1 is realized as quantizer 16-2 shown in FIG. 9.

In the example of FIG. 8A, the output signal 34-2 is shown for different attenuation levels of 10 dB, 11 dB and 12 dB of the input attenuator 10 of FIG. 1. The chosen values of 10 dB, 11 dB and 12 dB are only an example and may not be interpreted as limiting in any sense.

For a better understanding of the functioning of the quantizer 16-2 of FIG. 9, FIG. 8A also shows the signals 100 and 96 shown in FIG. 9.

An advantage of using the quantizer 16-2 may be understood by means of the following example: Assume the attenuation level of the input attenuator 10 in FIG. 1 is set to 10 dB and the RF level (input signal 20) increases such as indicated with arrow 109 in FIG. 8A. In this case, the quantization error of the control signal 24 in FIG. 1 and, hence, the level of signal 34-2 increases as indicated with arrow 110. When the quantization error reaches 1 dB (as indicated at 111), the input attenuator 10 will be set to the next higher attenuation level, here, 11 dB. Let's assume the input signal 20 decreases. In this case, the signal 34-2 will also decrease as indicated with arrow 112. In fact, as indicated with two-way arrow 113, in case the input signal 20 varies in a region 114, the input attenuator 10 will be controlled by control signal 24-2 (used as control signal 24 in FIG. 1) to stay at an attenuation level (by means of a respective first attenuation factor) of 11 dB (see also FIG. 8B). Thus, a hysteresis function is realized and advantageously employed to avoid frequent switching of the attenuation level of the input attenuator 10. Note in comparison, in case the embodiment of FIG. 2 would be used, in case the input signal would have a level oscillating around a point where the attenuation level would switch, e.g. 1 dB up or down, frequent switching between different attenuation levels would occur. This may be avoided when using the quantizer 16-2 of FIG. 9. Thus, when using the quantizer 16-2, there may be less "switching noise". Or in other words: situations when small noise causes attenuator switching at constant RF input level (when using e.g. the circuit 16-1 of FIG. 2) may be avoided. On the other hand, depending on the scenario of a practical application, the embodiment shown in FIG. 2 may also be suitable. FIG. 2 has the advantage of having relatively few components.

As shown in FIG. 9 for realizing the output signal 34-2 and a corresponding control signal 24-2 to control the input attenuator 10 of FIG. 1, the quantizer 16-2 includes an internal quantizing element 80, a subtracting unit 82, an adding unit 84, a saturation unit 86, a further subtracting unit 88, a further adding unit 90 and a storage element 92.

As seen, subtracting unit 88 receives, as input, the AGC control signal 26. Further, the further subtracting unit 88 receives a signal 100 output by storage element 92. The output signal 94 of the further subtracting unit 88 is generated by subtracting signal 100 from the AGC control signal 26.

Signal 94 is used as input for the internal quantizing element 80 and the subtracting unit 82. Based on signal 94, the internal quantizing element 80 generates the step AGC signal 24-2 which is depicted in FIG. 8B. As seen in FIG. 8B and as already indicated above, the attenuation also follows a hysteresis function. Thus, in case of an RF level of e.g. around point "a+1" in FIG. 8B, the attenuation stays at 11 dB and does not switch to the next higher or lower attenuation factor.

Subtracting unit 82 subtracts signal 94 from the control signal 24-2 to generate Signal 96. Note that signal 96 may also be referred to as "internal delta signal" which is shown in FIG. 8A for a better understanding of the functioning of the quantizer 16-2.

Signal 96 is used as input for adding unit 84 and further adding unit 90.

Adding unit 84 adds signal 100 and signal 96 to output signal 98 which is fed into saturation unit 86.

Saturation unit 86 realizes a "ceiling/flooring function". In case the input signal 98 is between the upper and lower saturation values (in the example of FIG. 9 +−0.5 dB) the output signal 102 of Saturation unit 86 is equal to the input signal. In case the input signal 98 is above or below upper and lower saturation values (in the example +−0.5 dB), the output value 102 will be either +0.5 dB or −0.5 dB. For example, if signal 98 is equal to −0.7 dB, the output signal would be −0.5 dB. Further example: if signal 98 is equal to +0.8 dB, the output signal would be +0.5 dB.

Further, as seen, further adding unit 90 adds signal 96 and signal 100 to generate the signal 34-2 which will be used as pre-step compensation signal 34 in FIG. 1.

The storage element 92 receives signal 102 output from saturation unit 86. The storage element 102 stores the last value from the last cycle (note that the system operates in discrete time). In other words, storage element 92 stores always the last output value of saturation unit 86 (the last referring to the value of the signal 102 in the last cycle). The initial value of storage element 92 may be set to 0 or other appropriate values.

Besides the embodiments of the quantizer as shown in FIGS. 2 and 9, the internal processing of the quantizer may involve further steps, e.g. multiplication by a constant factor. Or the quantizer might work without subtraction, by just using the higher bits as quantized signal and the lower bits as compensation signal.

Although specific embodiments have been illustrated and described herein, it will be appreciated by those of ordinary skill in the art that a variety of alternate and/or equivalent implementations may be substituted for the specific embodiments shown and described without departing from the scope of the described embodiments. This application is intended to cover any adaptations or variations of the specific embodiments discussed herein.

The invention claimed is:

1. A semiconductor device, comprising:
   an input attenuator configured to receive an antenna signal and to output a first attenuated signal, the first attenuated signal corresponding to the antenna signal attenuated by a first attenuation factor, the input attenuator being further configured to receive a control signal and to select one of a plurality of predetermined attenuation factors as the first attenuation factor depending on the control signal;
   an analogue to digital converter configured to generate an intermediate signal by digitizing said first attenuated signal;
   quantizing circuitry configured to receive an automatic gain control (AGC) signal and to output a quantized AGC signal corresponding to the control signal such that a certain one of the plurality of predetermined attenuation factors corresponds to one quantization step of the quantized AGC signal; and
   a digital attenuator configured to receive the intermediate signal and to output a second attenuated signal, the second attenuated signal corresponding to the intermediate signal attenuated by a second attenuation factor, the second attenuation factor being set so as to compensate a gain quantization error of the control signal.

2. The semiconductor device of claim 1, wherein the quantizing circuitry is further configured to generate a compensation signal for setting the second attenuation factor.

3. The semiconductor device of claim 1, further comprising delay compensation circuitry configured to delay the compensation signal so as to compensate a delay caused by the input attenuator and/or the analogue to digital converter.

4. The semiconductor device of claim 1, wherein the input attenuator is configured to operate with analogue signals.

5. The semiconductor device of claim 1, wherein the input attenuator comprises a plurality of resistors arranged in series between the input signal line of the input attenuator and ground, the input signal line being configured to transmit the antenna signal.

6. The semiconductor device of claim 5, further comprising a switch and a plurality of contacts respectively arranged between the plurality of resistors, the output of the switch corresponding to the first attenuated signal, wherein the switch is configured to generate the first attenuated signal by connecting the output of the switch to a selected one of the plurality of contacts, wherein the selection is done based on the control signal.

7. The semiconductor device of claim 1, wherein the antenna signal and the first attenuated signal are high frequency signals in a frequency range of 40 MHz to 1000 MHz.

8. The semiconductor device of claim 2, wherein the quantizing circuitry is further configured to generate the compensation signal so as to include a hysteresis function.

9. The semiconductor device of claim 3, wherein the digital attenuator is further configured to generate the second attenuated signal by applying the following function: $z=i \cdot 2^{-kx}$, where z: second attenuated signal,
i: intermediate signal, and
$2^{-kx}$: second attenuation factor.

10. The semiconductor device of claim 9, wherein x is the output signal of the delay compensation circuitry.

11. A television set including a semiconductor device, comprising:
an input attenuator configured to receive an antenna signal and to output a first attenuated signal, the first attenuated signal corresponding to the antenna signal attenuated by a first attenuation factor, the input attenuator being further configured to receive a control signal and to select one of a plurality of predetermined attenuation factors as the first attenuation factor depending on the control signal;
an analogue to digital converter configured to generate an intermediate signal by digitizing said first attenuated signal;
quantizing circuitry configured to receive an automatic gain control (AGC) signal and to output a quantized AGC signal corresponding to the control signal such that a certain one of the plurality of predetermined attenuation factors corresponds to one quantization step of the quantized AGC signal; and
a digital attenuator configured to receive the intermediate signal and to output a second attenuated signal, the second attenuated signal corresponding to the intermediate signal attenuated by a second attenuation factor, the second attenuation factor being set so as to compensate a gain quantization error of the control signal.

12. A method for attenuating an antenna signal, comprising:
selecting, using an input attenuator, one of a plurality of predetermined attenuation factors as first attenuation factor depending on a control signal;
generating, using the input attenuator, a first attenuated signal by attenuating the antenna signal by the first attenuation factor;
generating, using an analogue to digital converter, an intermediate signal by digitizing said first attenuated signal;
receiving, using quantizing circuitry, an automatic gain control (AGC) signal;
outputting, using the quantizing circuitry, a quantized AGC signal that is used as the control signal so that a certain one of the plurality of predetermined attenuation factors corresponds to one quantization step of the quantized AGC signal; and
generating, using a digital attenuator, a second attenuated signal, the second attenuated signal corresponding to the intermediate signal attenuated by a second attenuation factor, the second attenuation factor being set such as to compensate a gain quantization error of the control signal.

13. The method of claim 12, further comprising generating, using the circuitry, a compensation signal for setting the second attenuation factor.

14. The method of claim 12, further comprising compensating, using delay compensation circuitry, a delay caused by the input attenuator and/or the analogue to digital converter by delaying the compensation signal.

15. The method of claim 12, wherein the input attenuator is configured to operate with analogue signals.

16. The method of claim 12, wherein the antenna signal and the first attenuated signal are high frequency signals in a frequency range of 40 MHz to 1000 MHz.

17. The method of claim 13, further comprising generating, using the circuitry, the compensation signal so as to include a hysteresis function.

18. The method of claim 14, further comprising generating, using the digital attenuator, the second attenuated signal by applying the following function: $z=i \cdot 2^{-kx}$, where z: second attenuated signal,
i: intermediate signal, and
$2^{-kx}$: second attenuation factor.

19. The method of claim 18, wherein x is the output signal of the delay compensation circuitry.

20. A non-transitory computer readable storage medium encoded with program instructions, which when executed, causes circuitry to execute a method for attenuating an antenna signal, comprising:
selecting, using an input attenuator, one of a plurality of predetermined attenuation factors as first attenuation factor depending on a control signal;
generating, using the input attenuator, a first attenuated signal by attenuating the antenna signal by the first attenuation factor;
generating, using an analogue to digital converter, an intermediate signal by digitizing said first attenuated signal;
receiving, using quantizing circuitry, an automatic gain control (AGC) signal;
outputting, using the quantizing circuitry, a quantized AGC signal that is used as the control signal so that a certain one of the plurality of predetermined attenuation factors corresponds to one quantization step of the quantized AGC signal; and
generating, using a digital attenuator, a second attenuated signal, the second attenuated signal corresponding to the intermediate signal attenuated by a second attenuation factor, the second attenuation factor being set such as to compensate a gain quantization error of the control signal.

* * * * *